United States Patent [19]

Froese et al.

[11] 4,399,408
[45] Aug. 16, 1983

[54] APPARATUS FOR TESTING THE LINEARITY OF A FREQUENCY MODULATED OSCILLATOR

[75] Inventors: Abram Froese, North Vancouver; Josef L. Fikart, Port Coquitlam, both of Canada

[73] Assignee: Ael Microtel, Ltd., Burnaby, Canada

[21] Appl. No.: 239,758

[22] Filed: Mar. 2, 1981

[51] Int. Cl.³ ............................................. G01R 23/15
[52] U.S. Cl. ............................... 324/78 Z; 324/79 D; 331/44; 332/20
[58] Field of Search ...................... 331/44, 64; 332/18, 332/19, 20; 324/78 R–78 Z; 455/67, 115

[56] References Cited

U.S. PATENT DOCUMENTS

| | | | |
|---|---|---|---|
| 3,512,089 | 5/1970 | Cushman | 324/79 X |
| 3,549,997 | 12/1970 | Rotzel | 324/79 D |
| 3,571,760 | 3/1971 | Schwartz et al. | 324/79 D X |
| 4,122,391 | 10/1978 | Harp et al. | 324/78 Z |

Primary Examiner—Siegfried H. Grimm
Attorney, Agent, or Firm—Leonard R. Cool

[57] ABSTRACT

An APC (automatic phase control) circuit is utilized to measure the linearity of an FMO (frequency modulated oscillator). In accordance with a common APC concept a programmable divider is connected to an output of said frequency modulatable oscillator to produce a binary output signal having a predetermined pulse repetition rate. This signal is compared with a reference oscillator signal in a phase control comparator producing a DC control signal which is applied to the control input of said frequency modulated oscillator to maintain the average oscillator frequency constant. This DC control voltage gives an indication of average free running frequency of the oscillator.

To measure linearity, the said binary signal at the programmable divider output is also further divided and processed to produce a low frequency square waveform which is applied via a manual ON/OFF switch and a modulation amplifier to the modulation input of the said FMO. The change in the average free running frequency of the FMO, and the corresponding change in the DC control voltage resulting from alternatively switching the low frequency waveform ON and OFF, is a measure of the FMO's linearity. This change is amplified and a zero center meter is employed to indicate the magnitude and sign of the error, and to permit adjustment to obtain a minimum error indication.

3 Claims, 4 Drawing Figures

APPARATUS FOR TESTING THE LINEARITY OF A FREQUENCY MODULATED OSCILLATOR

BACKGROUND OF INVENTION

This invention relates to techniques for testing of the linearity of frequency modulated oscillators (FMO), and more particularly to the use of a low frequency modulating waveform, derived from the FMO's automatic phase control (APC) circuitry, in conjunction with the measurement of the APC control voltage when said waveform is applied to the FMO.

A frequency modulated oscillator is one whose instantaneous frequency follows an external modulating signal, called modulation. If this modulation is a symmetrical waveform and if the frequency modulated oscillator responds in a linear manner to this modulation there will be no net shift of the oscillator's average frequency while being modulated. If, however, the oscillator's response exhibits non-linearity of a certain kind, there will be a net shift in the oscillator's average frequency under modulation. This particular kind of non-linearity also happens to be one that must be carefully controlled and minimized in an FM system.

In many instances an automatic phase control (APC) circuit is used in a feedback loop around a frequency modulated oscillator (FMC) to stabilize the oscillator's frequency, usually by application of a DC correction voltage to the oscillator. If this feedback loop were broken, the oscillator would then oscillate at its free running frequency. If symmetrical modulation is applied to the oscillator and its response is non-linear, its free running frequency will shift. If the APC unit feedback loop is engaged at this time, the DC correction voltage will be adjusted to compensate for this frequency shift, thus giving a different voltage value than when the oscillator was unmodulated.

In many instances, circuitry can be incorporated within the oscillator to correct for its non-linear response to modulation. However, adjustment of this linearity correction circuitry affects the basic tuning of the oscillator, so changing its free running frequency also. Thus the DC control voltage to the oscillator will be affected by both the oscillator's non-linearity, and the detuning due to the linearity correction adjustment.

The circuitry described herein makes it possible to measure linearity and distinguish between the two above mentioned phenomena by the single expedient of alternatively switching the test modulation waveform ON and OFF while linearity is being adjusted until there is no difference in the meter reading. This is accomplished with circuitry which is intrinsic to the radio transmitter of which the FMO is a part. Previous approaches to this linearity measurement have required complex, specialized, expensive external testing equipment based upon different principles than the ones described above.

SUMMARY OF INVENTION

In accordance with this invention, apparatus for testing the linearity of a frequency modulated oscillator includes the application of a modulation test signal derived from the circuitry normally used only for FMO frequency control, and manually interrupted so as to obtain alternatively DC voltage values in the APC loop corresponding to the average free running oscillator frequency in the modulated and unmodulated states, respectively. This voltage is applied to one input of a comparator, whose other input is connected to a fixed reference voltage. The comparator amplifies the difference between the two inputs for deriving a signal that is measured by a zero-center meter.

During the linearity measurement and adjustment, the FMO is first fine tuned, with the modulation test signal OFF, to produce a center reading on the meter. Then the test signal is switched ON and if a non-center meter reading is obtained the linearity control on the FMO is adjusted to compensate. The above process is repeated until the reading in the ON state does not differ from that in the OFF state.

DETAILED DESCRIPTION OF PREFERRED EMBODIMENTS

Figure 1:
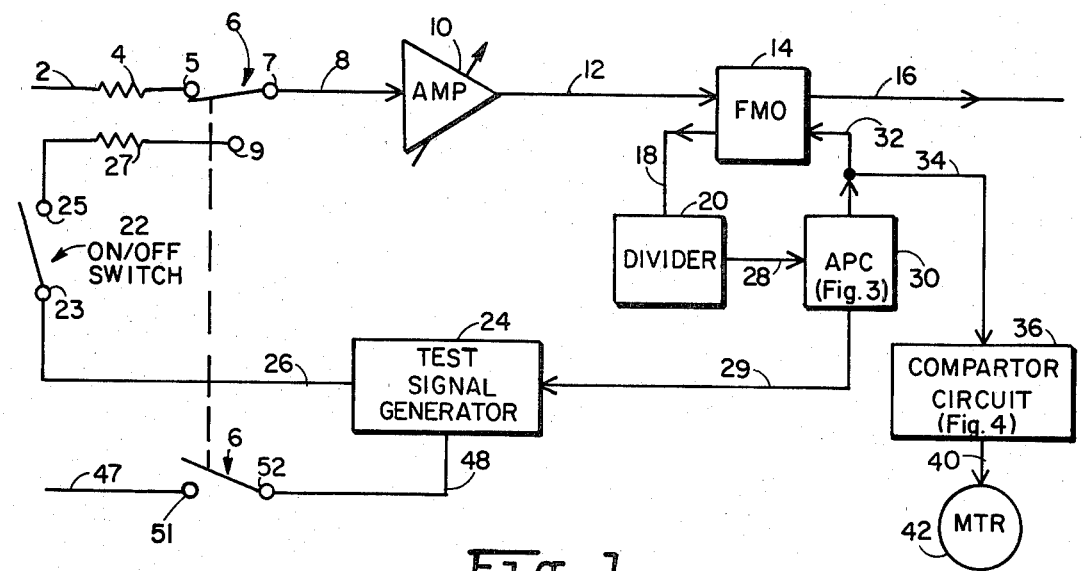
FIG. 1 is a block diagram of the preferred embodiment of the invention and including the modulation amplifier and the frequency modulated oscillator.

Referring now to FIG. 1, it may be seen that the normal modulation input frequencies to the modulation amplifier 10 and frequency modulated oscillator (FMO) 14 are applied via path 2, bridging resistor 4, multipole switch 6, terminals 5 and 7, and path 8 to the input of the modulation amplifier.

When this circuit is under test, multipole switch 6 is turned to the test position which then disconnects amplifier 10 from the normal modulation input and connects the output of linearity test signal generator 24 via path 26 and through contacts 23 and 25 of the ON/OFF switch 22 bridging resistor 27, multipole switch 6, terminals 9 and 7, and path 8 to the input of modulation amplifier 10.

Figure 2:
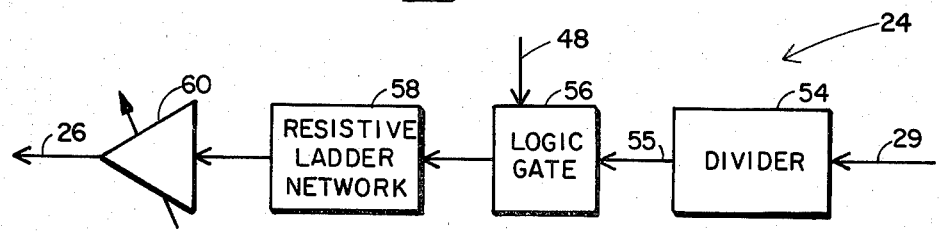
FIG. 2 is a block diagram of the linearity test generator.

The test signal generator is connected to the APC circuit via path 29, permanently generating a low frequency square wave from a specific pulse train available in the APC circuit. The output signal from the FMO is applied via path 16 to the external equipment which is not of concern here. An additional output of the FMO is applied via path 18 to divider 20 which is used to bring the signal frequency within the range of programmable divider which forms part of the automatic phase control (APC) circuit 30. Path 28 links divider 20 with the APC 30, operation of which will be described in detail hereinafter. The APC circuit divides the output frequency of divider 20 and compares this divided signal with an internally generated reference signal, producing a DC voltage appropriate to maintain the frequencies of these two signals equal, and to minimize the phase differences between them. This voltage is fed along path 32 to FMO 14 to control its frequency and simultaneously along path 34 to comparator circuit 36. The output of the comparator in test circuit 36 is a direct current signal which is either positive or negative with respect to a referenced voltage level. This direct current output signal on line 40 is measured on a zero center meter 42 during adjustment of the FMO to determine when the non-linearity is set to a minimum. Referring now to FIG. 2 it may be seen how the test signal generator is configured. For the purpose of the present invention the function of this circuit is reduced to generating a low frequency square wave of predetermined magnitude on path 26. When the linearity test mode is selected, multipole switch 6 closes allowing an enabling signal to pass along path 47 through contacts 51 and 52 and along path 48 into logic gate 56, causing the square waveform on path 55 to be passed through gate 56 into the resistive network 58 and amplifier 60. The two latter devices condition the square wave amplitude to cause the FMO to be deviated a prescribed amount for the test. This square wave is passed along path 26 and through contacts 23 and 25 of the ON/OFF switch 22 to the input of the modulation amplifier when the multipole switch 6 is set to connect contact 7 to contact 9. Thus, by operating switch 22, the square wave can be alternately connected and disconnected via the modulation amplifier 10 and path 12 to the modulation input of the frequency modulated oscillator 14 so as to alternately produce outputs from the frequency modulated oscillator 14 of the carrier frequency alone and the deviated test signal. If the oscillator is deviated linearly, it will produce frequency shifts symmetrical about the unmodulated or carrier frequency, thereby making the average free-running frequency of the modulated output equal to that of the unmodulated output.

Figure 3:
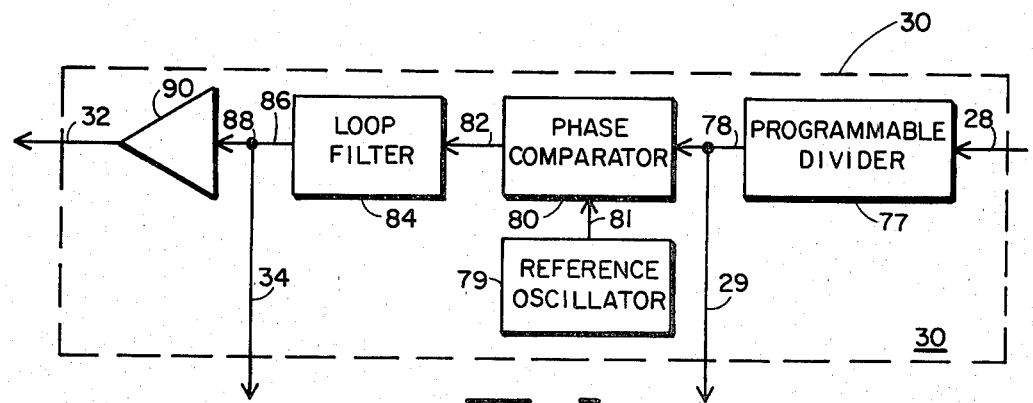
FIG. 3 is a block diagram of the automatic phase control circuit including the reference oscillator.

Referring now to FIG. 3 it may be seen that the output of divider 20 is passed along path 28 to programmable divider 77 which is programmed according to the nominal FMO output frequency to provide at its output a pulse train of a specific frequency. This pulse train is passed along path 78 to one input of phase comparator 80 where the phase of the pulse train is compared to that of a pulse train generated by reference oscillator 79 and connected via path 81. The phase comparator applies to path 82 a train of error pulses having a pulse width equal to the phase error between the two pulse trains at the inputs to the comparator (paths 78 and 81). This pulse train is applied to a loop filter 84. This loop filter integrates the error pulses to produce a DC output which is proportional to the deviation in the average free-running frequency of the FMO from its nominal oscillating frequency and which is used to control the FMO. The difference in the FMO control voltages between the unmodulated and the modulated states (i.e. the first and second control voltages, respectively) provides an indication of the FMO non-linearity. The direct current output from the loop filter 84 is applied via path 86 to buffer amplifier 90, and hence via path 32 to FMO 14, as well as via node 88 and path 34 to the comparator circuit 36.

Figure 4:
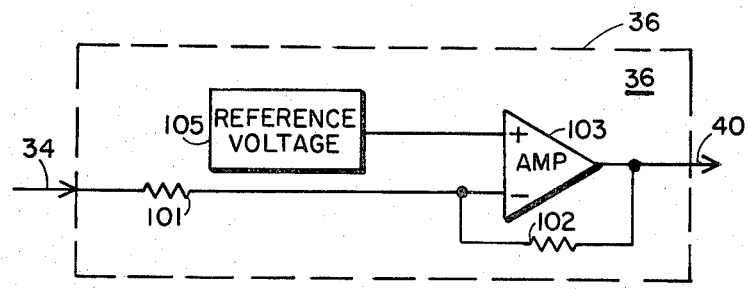
FIG. 4 is a diagram illustrating the comparator circuit.

Referring now to FIG. 4 it may be seen how the comparator circuit is configured. One input of the operational amplifier 103 is connected to a reference voltage. This voltage is chosen to be in the middle of the FMO control voltage range supplied by the APC circuit along path 32 (and also 34). The control voltages are supplied to the other input of amplifier 103 via path 34 and resistor 101. The output of amplifier 103 is looped back via resistor 102 to the negative input in the standard fashion to obtain a particular value of gain. The output is also passed along path 40 to meter 42 in FIG. 1. When the DC control voltage on path 34 is exactly equal to the reference voltage, the output on path 40 will also be at this same voltage and meter 42 shows center zero. This is the situation when, e.g. the FMO has been fine tuned with the square wave modulation turned off (by switch 22 in FIG. 1). On applying the square wave modulation signal by switch 22, the DC control voltage on path 34 will differ from the reference voltage if the FMO is nonlinear. This change will be amplified in amplifier 103 and shown as a deflection from center on meter 42 in FIG. 1. In the next step the FMO linearity control is adjusted with switch 22 still in the ON position to reduce the above deflection, which, however, also detunes the FMO. With switch 22 now OFF, the FMO is again fine tuned to re-establish the reference and the process is repeated until the meter remains at center for both positions of switch 22, i.e., regardless of whether the modulation test signal is ON or OFF.

While the invention has been particularly shown and described with reference to a preferred embodiment thereof, it will be understood by those skilled in the art that change in form and detail may be made therein without departing from the spirit and scope of the invention.

What is claimed is:

1. Apparatus for testing the linearity of a frequency modulated oscillator (FMO) having a modulation input and operating at an assigned carrier frequency comprising:

means for periodically applying a modulation test frequency signal to the modulation input of the FMO so as to alternately obtain the carrier alone and a modulated signal (resulting from the periodic application of said modulation test frequency signal) at the output of said frequency modulated oscillator;

means responsive to the average output frequency of said frequency modulated oscillator to alternately generate a first DC control signal derived from said carrier signal and a second DC control signal derived from said modulated signal;

means for separately comparing said first and second control signals with a DC reference voltage so as to provide at an output an error signal representative of the magnitude and sign of the difference between the amplitude of said first and second control signals; and means for measuring the magnitude and sign of the error signal so as to determine when the difference has been set to a minimum.

2. Apparatus as set forth in claim 1 wherein said means for applying comprises:

a programmable divider circuit having a divider input connected to receive the oscillator output signal; said divider being programmed to produce a binary output signal at a predetermined pulse repetition rate when the carrier is present;

a second divider circuit having an input connected to the output of said programmable divider circuit and providing at an output a square wave gating signal at a division ratio of 1:n of the output pulse repetition rate of said programmable divider circuit, where n is an integer selected to provide a low frequency base for the test signal;

a normal-test switch for switching the modulation input of the frequency modulated oscillator from a normal modulation signal path to a test position path applying the test signal;

a logic gate which has one input connected to the output of said second divider circuit, said logic gate being enabled when the frequency modulated oscillator is switched to the test position path, so as to produce the test signal at an output;

a test signal conditioning circuit having an input connected to the output of said logic gate and an output connected to the input of said applying means whereby a test signal having a predetermined amplitude is created; and switch means for alternately applying and interrupting said test signal to said frequency modulated oscillator.

3. Apparatus as in claim 2 wherein said means responsive comprises:

a phase comparator having a first input connected to the output of said programmable divider circuit, having a second input connected to a reference oscillator and providing a phase error signal at an output when the signals applied to the first and second inputs are not in phase; and a loop filter having an input connected to the output of said phase comparator and providing at an output a DC voltage which is representative of the control voltage for the frequency modulated oscillator, said DC voltage being the first control signal voltage when the carrier frequency is present and being the second control voltage when the modulation test frequency is applied to the frequency modulated oscillator.

* * * * *